US012602200B2

(12) United States Patent
Wang et al.

(10) Patent No.: US 12,602,200 B2
(45) Date of Patent: Apr. 14, 2026

(54) ANALOG MULTIPLY-ACCUMULATE UNIT FOR MULTIBIT IN-MEMORY CELL COMPUTING

(71) Applicant: Intel Corporation, Santa Clara, CA (US)

(72) Inventors: Hechen Wang, Hillsboro, OR (US); Renzhi Liu, Portland, OR (US); Richard Dorrance, Hillsboro, OR (US); Deepak Dasalukunte, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1056 days.

(21) Appl. No.: 17/485,179

(22) Filed: Sep. 24, 2021

(65) Prior Publication Data

US 2022/0012016 A1 Jan. 13, 2022

(51) Int. Cl.
| | |
|---|---|
| *G06F 7/544* | (2006.01) |
| *G06F 7/523* | (2006.01) |
| *G06N 3/04* | (2023.01) |
| *H03M 1/78* | (2006.01) |
| *H03M 1/80* | (2006.01) |

(52) U.S. Cl.
CPC ............ *G06F 7/5443* (2013.01); *G06F 7/523* (2013.01); *G06N 3/04* (2013.01); *H03M 1/78* (2013.01); *H03M 1/802* (2013.01)

(58) Field of Classification Search
CPC ................... G06F 7/5443; G06F 7/523; G06F 2207/4814; G06N 3/04; G06N 3/063; H03M 1/78; H03M 1/802; H03M 1/80; G11C 11/16; G11C 13/0004; G11C 7/1006; G11C 11/54; G06J 1/00
See application file for complete search history.

(56) References Cited

U.S. PATENT DOCUMENTS

| | | | |
|---|---|---|---|
| 2005/0105791 A1* | 5/2005 | Lee ........................ | G01N 21/47 |
| | | | 382/145 |
| 2019/0045462 A1* | 2/2019 | Sutskover ........... | H04W 52/367 |

FOREIGN PATENT DOCUMENTS

WO   WO-2020257531 A1 * 12/2020 ........... G06F 7/5443

OTHER PUBLICATIONS

H. Balasubramaniam, W. Galjan, W. H. Krautschneider and H. Neubauer, "12-bit hybrid C2C DAC based SAR ADC with floating voltage shield," 2009 3rd International Conference on Signals, Circuits and Systems (SCS), Medenine, Tunisia, 2009, pp. 1-5, doi: 10.1109/ICSCS.2009.5412227. (Year: 2009).*

(Continued)

*Primary Examiner* — Nicholas Klicos
*Assistant Examiner* — Jakob Oscar Gudas
(74) *Attorney, Agent, or Firm* — Akona IP PC

(57) ABSTRACT

Systems, apparatuses and methods include technology that receives, with a first plurality of multipliers of a multiply-accumulator (MAC), first digital signals from a memory array, wherein the first plurality of multipliers includes a plurality of capacitors. The technology further executes, with the first plurality of multipliers, multibit computation operations with the plurality of capacitors based on the first digital signals, and generates, with the first plurality of multipliers, a first analog signal based on the multibit computation operations.

25 Claims, 13 Drawing Sheets

300

(56) References Cited

OTHER PUBLICATIONS

B. Yan et al., "RRAM Based In-Memory Computing: From Device and Large-Scale Integration System Perspectives," Advanced Intelligent Systems, Aug. 2019, 17 pages.
M. Le Gallo et al., "In-Memory Computing: Towards Energy-Efficient Artificial Intelligence," <ercim-news.ercim.eu/en115/r-i/2115-in-memory-computing-towards-energy-efficient-artificial-intelligence>, Oct. 24, 2018, 4 pages.

* cited by examiner

800

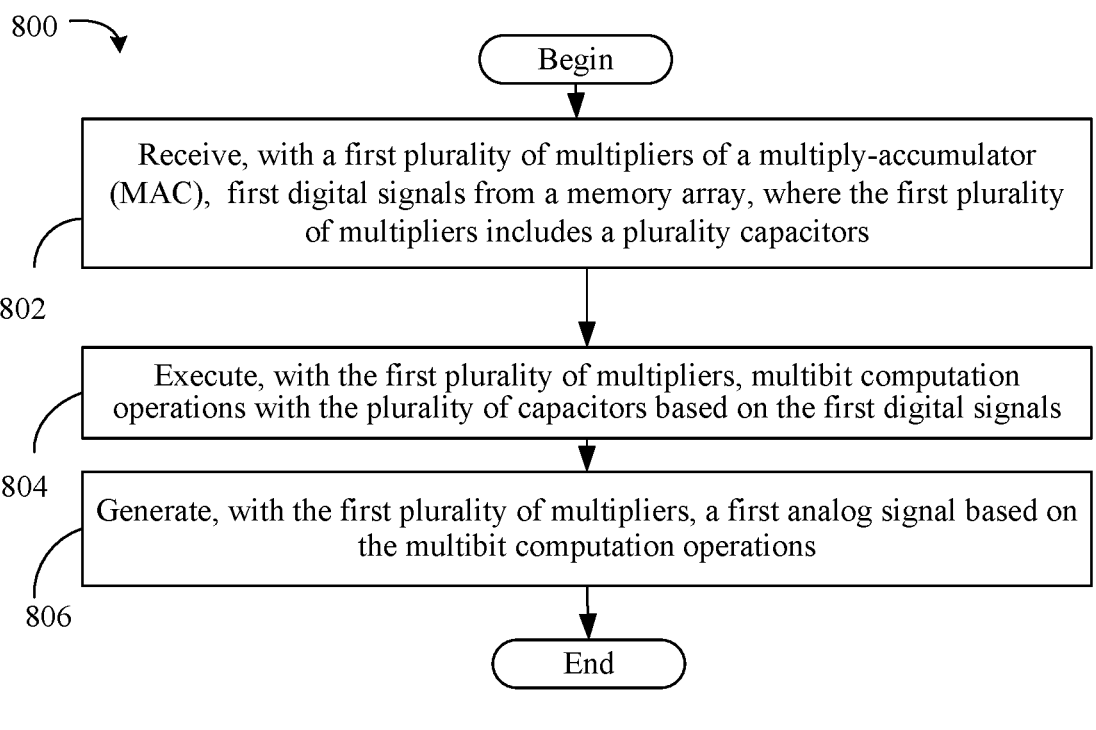

Begin

Receive, with a first plurality of multipliers of a multiply-accumulator (MAC), first digital signals from a memory array, where the first plurality of multipliers includes a plurality capacitors

802

Execute, with the first plurality of multipliers, multibit computation operations with the plurality of capacitors based on the first digital signals

804

Generate, with the first plurality of multipliers, a first analog signal based on the multibit computation operations

806

End

ANALOG MULTIPLY-ACCUMULATE UNIT FOR MULTIBIT IN-MEMORY CELL COMPUTING

TECHNICAL FIELD

Embodiments generally relate to an in-memory multiply-accumulate (MAC) architecture. More particularly, embodiments relate to an in-memory MAC architecture that executes a MAC operation based on an analog input signal and digital signals to output an analog output signal based on the same.

BACKGROUND

Some architectures (e.g., non-Von Neumann computation architectures) may employ "Compute-in-Memory" (CiM) techniques to bypass von Neumann bottleneck" data transfer issues and execute convolutional neural network (CNN) as well as deep neural network (DNN) applications. The development of such architectures may be challenging in digital domains since MAC operation units of such architectures are too large to be squeezed into high-density Manhattan style memory arrays. For example, the MAC operation units may be magnitudes of order larger than corresponding memory arrays. For example, in a 4-bit digital system, a digital MAC unit may include 800 transistors, while a 4-bit Static random-access memory (SRAM) cell only contains 24 transistors. Such an unbalanced transistor ratio makes it difficult, if not impossible to efficiently fuse the SRAM with the MAC unit. Thus, in von-Neumann architectures are commonly employed in which memory units are physically separated from processing units. The data is serially fetched from the storage layer by layer, which results in a great latency and energy overhead.

BRIEF DESCRIPTION OF THE DRAWINGS

The various advantages of the embodiments will become apparent to one skilled in the art by reading the following specification and appended claims, and by referencing the following drawings, in which:

FIG. 3 is a flowchart of an example of a method of a multiplication process with an enhanced MAC according to an embodiment;

FIG. 12 is a block diagram of an example of a multiprocessor based computing system according to an embodiment.

DESCRIPTION OF EMBODIMENTS

Some embodiments include a practical and efficient in-memory computing architecture that includes an integrated MAC unit and memory cell (which may be referred to as an arithmetic memory cell). The arithmetic memory cell employs analog computing methods so that a number of transistors of the integrated MAC unit is similar to a number of transistors of the memory cell (e.g., the transistors are a same order of magnitude) to reduce compute latency.

For example, a neural network may be represented as a structure that is a graph of neuron layers flowing from one to the next. The outputs of one layer of neurons are the inputs of the next. To perform these calculations, a variety of matrix-vector, matrix-matrix, and tensor operations are required, which are themselves comprised of many MAC operations. Indeed, there are so many of these MAC operations in a neural network, that such operations may dominate other types of computations (e.g., the Rectified Linear Unit (ReLU) activation and pooling functions). Therefore, the MAC operation is enhanced by reducing data fetches from long term storage and distal memories separated from the MAC unit. Thus, embodiments herein merge the MAC unit with the memory to reduce longer latency data movement and fetching, particularly for neural network applications.

Further, some embodiments employ analog based mixed-signal computing, which is more efficient than digital (e.g., at low precision), to reduce data movement costs in conventional digital processors and circumvent energy-hungry analog to digital conversions. Other architectures may be limited to singular bit analysis. Embodiments as described herein execute multi-bit operations based on the analog signals. In further detail, some embodiments include a C-2C ladder based analog MAC unit for multibit compute-in-memory architecture (e.g., SRAM among others).

Figure 1A:
FIG. 1A is a block diagram of an example of an in-memory multiplier architecture according to an embodiment.
Figure 1B:
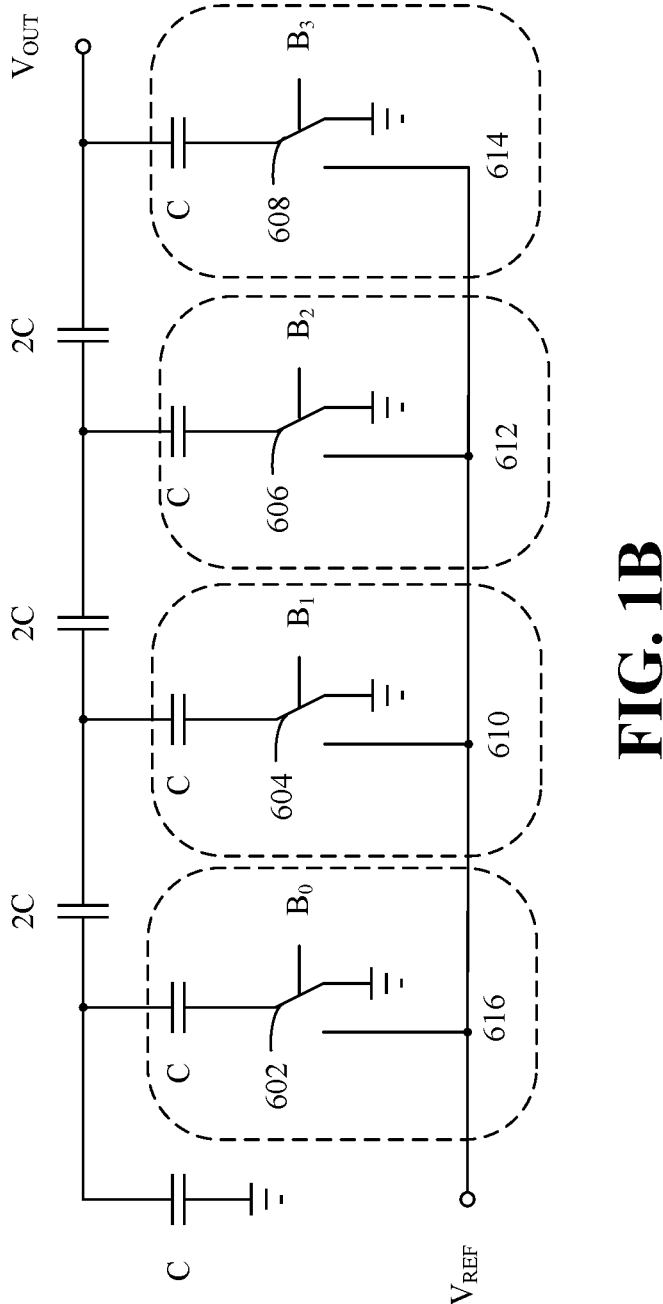
FIG. 1B is a block diagram of an example of a C-2C ladder according to an embodiment.

For example, FIG. 1B illustrates a C-2C ladder 600. The C-2C ladder 600 may execute multiplication operations, and is capacitor network in digital-to-analog converter (DAC) designs to provide analog voltage outputs. As illustrated in FIG. 1B, the C-2C ladder 600 includes of a series of capacitors C segmented into branches 616, 610, 612, 614. Each branch 616, 610, 612, 614 contains one switch of switches 602, 604, 606, 608 and a capacitor C that is one unit capacitance. A serial capacitor 2C with a capacitance of two unit capacitance is inserted between each of two branches 616, 610, 612, 614.

The switches 602, 604, 606, 608 are controlled by digital bits and connected to either a fixed reference voltage VREF or a ground node (GND). Ratioed by the serial capacitors 2C, the contributions of the branches 616, 610, 612, 614 are binary weighted along the C-2C ladder 600 and superimposed onto the output node of the C-2C ladder 600. As a result, the voltage at the output corresponds to the digital bits applied to those switches with a scaling factor of VREF, as expressed in the following equation:

$$V_{OUT} = V_{REF} \sum_{i=0}^{m-1} B_i \times \frac{1}{2^{m-i}}$$

<div align="right">Equation 1</div>

In Equation 1, m is the number of branches 616, 610, 612, 614 in the C-2C ladder 600. As will be discussed in further detail, an equivalent circuit to the C-2C ladder 600 may be adjusted to be included as part of a MAC to implement a multibit multiplication operation. Doing so enables a reduced number of transistors to be utilized and lowers energy consumption.

Thus, some embodiments provide a multibit in-memory MAC solution that may overcome the von-Neumann bottleneck challenge in conventional computation architectures. Moreover, such embodiments provide a reduced power consumption at an enhanced linearity. Furthermore, a hardware overhead of the analog MAC unit is similar to the memory cell, thus enabling an in-memory computing scheme where the MAC unit is integrated with the memory cell to enhance performance.

Turning to FIG. 1A, an in-memory multiplier architecture 300 includes memory array 302 (which is coupled to one or more unillustrated substrates) and a C-2C based multiplier 304 (which may be also coupled to the one or more substrates) and the memory array 302, where the C-2C based multiplier 304 includes a plurality of multipliers 304a, 304b, 304c, 304d (e.g., a first plurality of multipliers) that include a plurality capacitors 298, 292, 294, 296, 322, 350, 352 that have capacitances of C and 2C. The plurality of multipliers 304a, 304b, 304c, 304d is configured to receive digital signals from the memory array 302, execute multibit computation operations with the plurality of capacitors 298, 292, 294, 296, 322, 350, 352 based on the digital signals and output a first analog signal $OA''$ based on the multibit computations. The computation operations may be further be based on an input analog signal $IA''$. The memory array 302 includes first, second, third and fourth memory cells 302a, 302b, 302c, 302d. The input activation signal $IA''$ may be provided from a first layer of the neural network, while the in-memory multiplier architecture 300 may represent a second layer of the neural network. For example, the C-2C based multiplier 304 may be applied to any layer of a neural network. The superscript "n" indicates that it is applied to (operates on) the nth layer of the neural network. As such, the C-2C based multiplier 304 (e.g., an in-memory multiplier) represents the nth layer of the neural network. $IA''$ is the input activation signal at the nth layer, and is the output of the previous layer (layer n–1). $OA''$ is the output signal at the nth layer, and it will be feed into the next layer (layer n+1) which may be similar to the in-memory multiplier architecture 300.

Each of the plurality of multipliers 304a, 304b, 304c, 304d is associated with a respective one of the first, second, third and fourth memory cells 302a, 302b, 302c, 302d. For example, a first arithmetic memory cell 308 includes the first multiplier 304a and the first memory cell 302a such that the first multiplier 304a receives digital signals (e.g., weights) from the first memory cell 302a. A second arithmetic memory cell 310 includes the second multiplier 304b and the second memory cell 302b such that the second multiplier 304b receives digital signals (e.g., weights) from the second memory cell 302b. A third arithmetic memory cell 312 includes the third multiplier 304c and the third memory cell 302c such that the third multiplier 304c receives digital signals (e.g., weights) from the third memory cell 302c. A fourth arithmetic memory cell 314 includes the fourth multiplier 304d and the second memory cell 302d such that the fourth multiplier 304d receives digital signals (e.g., weights) from the fourth memory cell 302d. In detail, the weights W, obtained during a neural network training progress and preloaded in the network, are stored in a digital format for information fidelity and storage robustness. With respect to the input activation (which is the analog input signal $IA''$) and the output activation (which is the analog output signal $OA''$), the priority may be shifted to the dynamic range and response latency. That is, analog scalars of analog signals, with an inherent unlimited number of bits and continuous time-step, outperforms other storage candidates Thus, the in-memory multiplier architecture 300 (e.g., a neural network) receives the analog input signal $IA''$ (e.g., an analog waveform) as an input and stores digital bits as its weight storage to enhance neural network application performance, design and power usage. As will be discussed below, the first, second, third and fourth memory cells 302a, 302b, 302c, 302d store different bits of a same multibit weight.

The first arithmetic memory cell 308 of the first, second, third and fourth arithmetic memory cell 308, 310, 312, 314 is discussed below as an exemplary embodiment and for brevity, but it will be understood that second, third and fourth arithmetic memory cells 310, 312, 314 are similarly configured to the first arithmetic memory cell 308. The first memory cell 302a stores a first digital bit of a weight in a digital format. That is, the first memory cell 302a includes first, second, third and fourth transistors 400, 402, 404, 406. The combination of the first, second, third and fourth transistors 400, 402, 404, 406 store and output the first digital bit of the weight. For example, the first, second, third and fourth transistors 400, 402, 404, 406 output weight signals $W''_{0(0)}$ and $Wb''_{0(0)}$ which represent a digital bit of the weight. The conductors that transmit the signal weight $W_{0(0)}$ are represented as an unbroken line and the conductors that conduct the weight signal $Wb''_{0(0)}$ are represented as a broken line for clarity.

The fifth and sixth transistors 408, 410 may selectively conduct electrical signals from the bit lines $BL_{(0)}$ and $BLb_{(0)}$ in response to an electrical signal of the word line WL meeting a threshold (e.g., voltage of the word line WL exceeds a voltage threshold). That is, the electrical signal of the word line WL is applied to gates of the fifth and sixth transistors 408, 410 and the electrical signals of the bit lines $BL_{(0)}$ and $BLb_{(0)}$ are applied to sources of the fifth and sixth transistors 408, 410.

The signals $W''_{0(0)}$ and $Wb''_{0(0)}$ from the first memory cell 302a is provided to the first multiplier 304a and as shown schematically by the locations of the weight signals $W''_{0(0)}$ and $Wb''_{0(0)}$ (which represent the digital bit). The first multiplier 304a includes capacitors 298, 322. The capacitor 322 may include a capacitance 2C that is double a capacitance C of capacitor 298. A switch 354 may be formed by a first pair of transistors 318 and a second pair of transistors 320.

The first pair of transistors 318 may include transistors 318a, 318b and selectively couple the input analog signal $IA''$ (e.g., input activation) to capacitor 298 based on the weight signals $W_{0(0)}, Wb''_0$. The second pair of transistors 320 may include transistors 320a, 320b that selectively couple the capacitor 298 to ground based on the weight signals $W''_{0(0)}, Wb''_{0(0)}$. Thus, the capacitor 298 is selectively coupled between ground and the input analog signal IA" based on the weight signals $W''_{0(0)}$, $Wb''_{0(0)}$. That is, one of the first and second pairs of transistors 318, 320 may be in an ON state to electrically conduct signals, while the other of the first and second pairs of transistors 318, 320 may be in an OFF state to electrically disconnect terminals. For example in a first state, the first pair of transistors 318 may be in an ON state to electrically connect the capacitor 298 to the input analog signal IA" while the second pair of transistors 320 is an OFF state to electrically disconnect the capacitor 298 from ground. In a second state, the second pair of transistors 320 may be in an ON state to electrically connect the capacitor 298 to the ground while the first pair of transistors 318 is an OFF state to electrically disconnect the capacitor 298 from the input analog signal IA". Thus, the capacitor 298 is selectively electrically coupled to the ground or the input analog signal IA" based on the weight signals $W''_{0(0)}$ and $Wb''_{0(0)}$.

As already stated, the second, third and fourth arithmetic memory cells 310, 312, 314 are formed similarly to the first arithmetic memory cell 308. That is, bit lines $BL_{(1)}$, $BLb_{(1)}$ and word line WL selectively control the second memory cell 302b to generate and output the weight signals $W''_{0(1)}$ and $Wb''_{0(1)}$ (which represents a second bit of the weight). The second multiplier 304b includes a capacitor 292 that is selectively electrically coupled to the ground or the input analog signal IA" through switch 286 and based on the weight signals $W''_{0(1)}$ and $Wb''_{0(1)}$ generated by the second memory cell 302b.

Similarly, bit lines $BL^{(2)}$, $BLb_{(2)}$ and word line WL selectively control the third memory cell 302c to generate and output the weight signals $W''_{0(2)}$ and $Wb''_{0(2)}$ (which represents a second bit of the weight). The third multiplier 304c includes a capacitor 294 that is selectively electrically coupled to the ground or the input analog signal IA" through switch 288 based on the weight signals $W''_{0(2)}$ and $Wb''_{0(2)}$ generated by the second memory cell 302b. Likewise, bit lines $BL_{(3)}$, $BLb_{(3)}$ and word line WL selectively control the fourth memory cell 302d to generate and output the weight signals $W''_{0(3)}$ and $Wb''_{0(3)}$ (which represents a fourth bit of the weight). The fourth multiplier 304d includes a capacitor 296 that is selectively electrically coupled to the ground or the input analog signal IA" through switch 290 based on the weight signals $W''_{0(3)}$ and $Wb''_{0(3)}$ generated by the second memory cell 302b. Thus, each of the first-fourth arithmetic memory cell 308, 310, 312, 314 provides an output based on the same input activation signal IA" but also on a different bit of the same weight.

The first-fourth arithmetic memory cell 308, 310, 312, 314 operate as a C-2C ladder multiplier as described with respect to C-2C ladder 600 (FIG. 1B). Connections between different branches includes the capacitors 322, 350, 352. The second, third and fourth multipliers 304b, 304c, 304d are respectively downstream of the first, second and third multipliers 304a, 304b, 304c. Thus, outputs from the first, second and third multipliers 304a, 304b, 304c and/or first, second and third arithmetic memory cells 308, 310, 312 are binary weighted through the capacitors 322, 350, 352. As illustrated, the fourth arithmetic memory cell 314 does not include a capacitor at an output thereof since there is no arithmetic memory cell downstream of the fourth arithmetic memory cell 314. The product is then obtained at the output node at the end of the C-2C ladder. The in-memory multiplier architecture 300 may generate the output analog signal OAR, which corresponds to the below equation 2. Equation 2 is an equation of an m-bit multiplier:

$$IA \times \sum_{i=0}^{m-1} W_i \times \frac{1}{2^{m-i}} \qquad \text{Equation 2}$$

In Equation 2, m+1 is equal to the number of bits of the weight. In this particular example, m is equal to three (m iterates from 0-3) since there are 4 weight bits as noted above. The "i" in Equation 1 corresponds to a position of a weight bit (again ranging from 0-3) such that $W_i$ is equal to the value of the bit at the position. It is worthwhile to note that Equation 2 is applicable to any m-bit weight value. For example, if hypothetically the weight included more bits, more arithmetic memory cells may be added do the in-memory multiplier architecture 300 to process those added bits (in a 1-1 correspondence).

Thus, the in-memory multiplier architecture 300 employs a cell charge domain multiplication method by implementing a C-2C ladder DAC. The C-2C ladder may be a capacitor network including capacitors 298, 292, 294, 296 having capacitance C, and capacitors 322, 350, 352 that have capacitance 2C. The capacitors 298, 292, 294, 296, 322, 350, 352 are segmented into branches and may provide low power analog voltage outputs such as OAR.

As illustrated in FIG. 1A, the in-memory multiplier architecture 300 is segmented into branches that each include one of the capacitors 298, 292, 294, 296 (that include one unit capacitance and may be referred to as a first group of capacitors) and one of the switches 354, 286, 288, 290. One of the capacitors 322, 350, 352 (with a two unit capacitance and may be referred to as a may be referred to as a second group of capacitors) is inserted in electrical connections (e.g., conductors) that connect the plurality of branches and between each pair of branches (e.g., between two branches) to be in serial with each other. Thus, the capacitors 322, 350, 352 connect the various branches.

Ratioed by the capacitors 322, 350, 352 that are aligned in serial with each other, the contributions of the different branches are binary weighted along the ladder and superimposed onto an output node of the C2C ladder. As a result, the voltage of analog output signal OA" (e.g., at the output) corresponds to the digital bits applied to the switches 354, 286, 288, 290 with a scaling factor of the analog input signal, which is described by Equation 2. For example, the lowest order bits may be disposed farther away from the output such that the electrical signals therefrom propagate through several capacitors 322, 350, 352. Thus, the lowered ordered bit of the weight would be processed by the first arithmetic memory cell 308 and the highest order bit of the weight would be processed by the fourth arithmetic memory cell 314 to scale outputs therefrom.

Each branch and/or first, second, third and fourth arithmetic memory cells 308, 310, 312, 314 corresponds to one digital bit. Thus, scaling up to any arbitrary number of bits is achieved through the addition of further arithmetic memory cells (e.g., four branches for a 4-bit weight value, eight branches for an 8-bit weight value, etc.).

The memory array 302 and the C-2C based multiplier 304 may be disposed proximate to each other. For example, the memory array 302 and the C-2C based multiplier 304 may be part of a same semiconductor package and/or in direct contact with each other. Moreover, the memory array 302 may be an SRAM structure, but the memory array 302 may be readily modified to be of various memory structures (e.g., dynamic random-access memory, magnetoresistive random-access memory, phase-change memory, etc.) without modifying operation of the C-2C based multiplier 304 above.

Figure 2A:
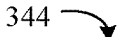
FIGS. 2A and 2B are block diagrams of an example of a MAC architecture with accumulation according to an embodiment.

Turning now to FIG. 2A, a MAC architecture 344 with accumulation of charge is illustrated. The MAC architecture 344 includes first, second and third in-memory multiplier architectures 336, 338, 340. Each of the first, second and third in-memory multiplier architectures 336, 338, 340 may be formed similarly to the in-memory multiplier architecture 300 (FIG. 1A) already discussed. Thus, similar operations will be omitted from description.

In this example, the first in-memory multiplier architecture 336 processes a digital first weight, that has 4 bits, based on an input analog signal IA"$_0$. For example, a first arithmetic memory cell 658 generates an output based on a value of the zero bit position of the first weight and the input analog signal IA"$_0$, a second arithmetic memory cell 660 generates an output based on a value of the first bit position of the first weight and the input analog signal IA"$_0$, a third arithmetic memory cell 662 generates an output based on a value of the second bit position of the first weight and on the input analog signal IA"$_0$ and the fourth arithmetic memory cell 664 generates an output based on a value of the third bit position of the first weight and the input analog signal IA"$_0$. The outputs are merged to generate a first output for the first in-memory multiplier architecture 336.

The second in-memory multiplier architecture 338 processes a digital second weight, that has 4 bits, based on an input analog signal IA"$_1$. For example, a first arithmetic memory cell 666 generates an output based on the zero bit position of the second weight and the input analog signal IA"$_1$, a second arithmetic memory cell 668 generates an output based on the first bit position of the second weight and the input analog signal IA"$_1$, a third arithmetic memory cell 670 generates an output based on a value of the second bit position of the second weight and on the input analog signal IA"$_1$ and the fourth arithmetic memory cell 672 generates an output based on a value of the third bit position of the second weight and the input analog signal IA"$_1$. The outputs are merged to generate a second output for the second in-memory multiplier architecture 338.

The third in-memory multiplier architecture 340 processes a digital third weight, that has 4 bits, based on an input analog signal IA"$_2$. For example, a first arithmetic memory cell 328 generates an output based on a value of a zero bit position of the third weight and the input analog signal IA"$_1$, a second arithmetic memory cell 330 generates an output based on the second bit position of the third weight and the input analog signal IA"$_2$, a third arithmetic memory cell 332 generates an output based on a value of the third bit position of the third weight and on the input analog signal IA"$_3$ and the fourth arithmetic memory cell 334 generates an output based on a value of the third bit position of the third weight and the input analog signal IA"$_2$. The outputs are merged to generate a third output for the third in-memory multiplier architecture 340.

Switches 650, 652, 654 selectively electrically connect the first, second and third in-memory multiplier architectures 336, 338, 340 to the summer 342 (e.g., an accumulator and/or adder). For example, a part of a MAC operation is accumulation, which adds all the results from the first, second and third in-memory multiplier architectures 336, 338, 340 together and generates an average of the results. For example, the summer 342 may accumulate by simply connecting all the output nodes of the first, second and third in-memory multiplier architectures 336, 338, 340 (e.g., C-2C ladders) together. The electric charge (e.g., the first, second and third outputs) on the output nodes will be merged and form a summation in the summer 342. The voltage signal at this combined node corresponds to a total charge held by the overall capacitances of the first, second and third in-memory multiplier architectures 336, 338, 340. The summer 342 may generate an output that corresponds to the following equation 3:

$$OA^n = \frac{1}{k} \times \sum_{j=0}^{k-1} \left[ IA^n_{j\in(0\ to\ k-1)} \times \sum_{i=0}^{m-1} W^n_{j,i} \times \frac{1}{2^{m-i}} \right] \quad \text{Equation 3}$$

In Equation 3, IA"$_j$ corresponds to the input activation signal, "k" is the number of multipliers in one MAC unit, for example the MAC architecture 344, W is the weight value, n is a layer index in a neural network associated with the MAC architecture 344 (e.g., that will be processed), "m" is number of arithmetic memory cells per multiplier of the MAC architecture 344 (e.g., the number of bits associated with the multipliers). The above equation 3 provides the value at the output of the MAC architecture 344. From the equation, it can be observed that the output activation is scaled by a factor of 1/k. Thus, the maximum of the output signal cannot exceed 1, which is the supply voltage of the system. An inherent normalization process is further performed automatically without any additional hardware. Doing so also eliminates all the potential overflow conditions. An equivalent Equation 4 to Equation 3 is provided below, and reflects the summation of the summer 342.

$$OA^n = \frac{1}{k} \times \sum_{j=0}^{k-1} \sum_{i=0}^{m-1} IA^n_j \times W^n_{j(i)} \times \frac{1}{2^{m-i}} \quad \text{Equation 4}$$

Figure 2B:
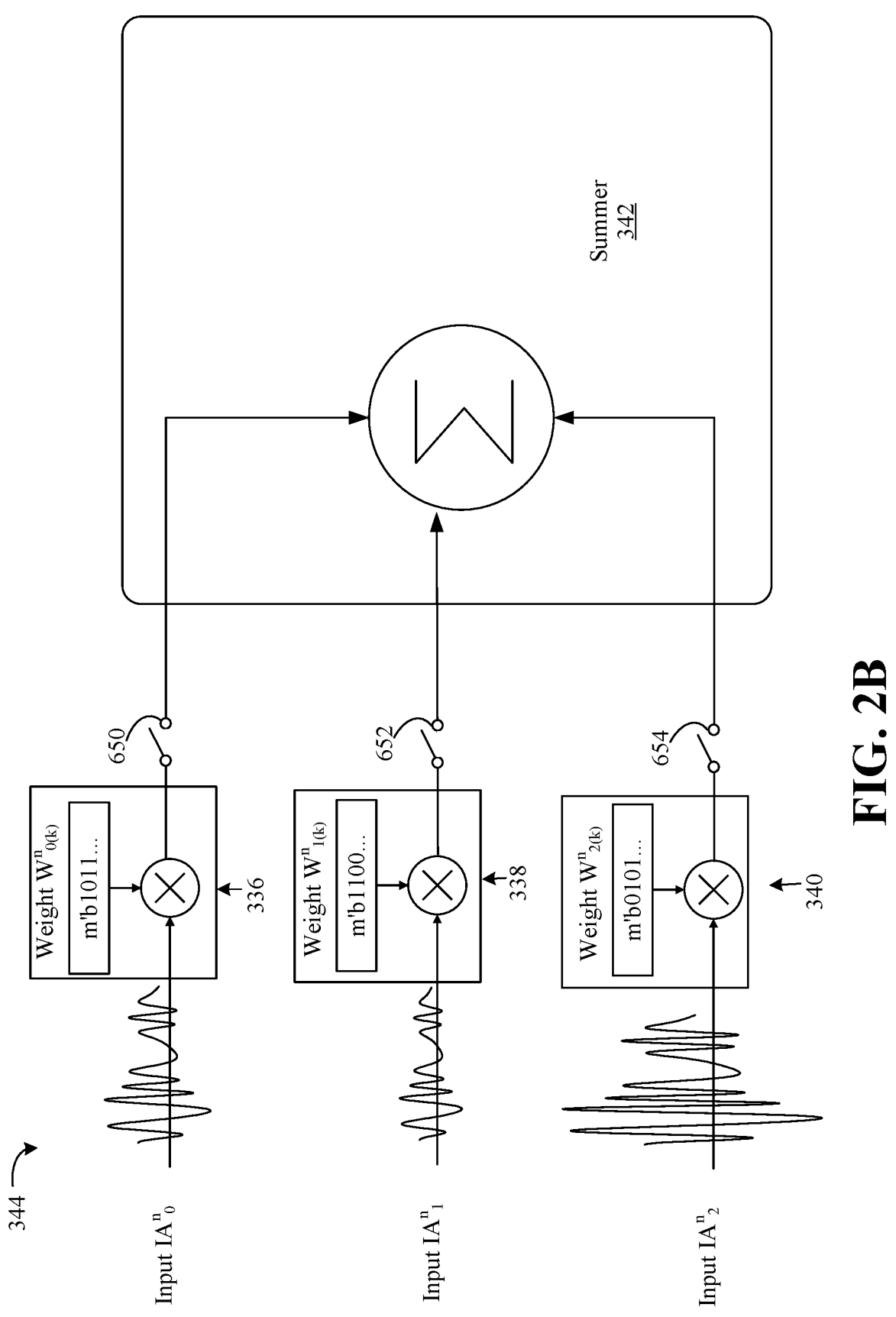

In Equation 4, the variables are the same as discussed with respect to Equation 3. FIG. 2B illustrates a graphical schematic of the operations executed by the MAC architecture 344. In FIG. 2B, input analog signals IA"$_0$-IA"$_2$ are input into the first, second and third in-memory multiplier architectures 336, 338, 340. The first, second and third in-memory multiplier architectures 336, 338, 340 also include different weights W"$_{0(k)}$-W"$_{2(k)}$. Outputs of the first, second and third in-memory multiplier architectures 336, 338, 340 are combined in the summer 342.

FIG. 3 shows a method 800 of executing a multiplication process with an enhanced in-memory MAC. The method 800 may generally be implemented with the embodiments described herein, for example, the in-memory multiplier architecture 300 (FIG. 1A), the C-2C ladder (600) and/or MAC architecture 344 (FIGS. 2A and 2B), already discussed. In an embodiment, the method 800 is implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 800 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 802 receives, with a first plurality of multipliers of a multiply-accumulator (MAC), first digital signals from a memory array, where the first plurality of multipliers includes a plurality capacitors. Illustrated processing block 804 executes, with the first plurality of multipliers, multibit computation operations with the plurality of capacitors based on the first digital signals. Illustrated processing block 806 generates, with the first plurality of multipliers, a first analog signal based on the multibit computation operations.

In some examples, the plurality of capacitors includes a first group of capacitors and a second group of capacitors, the first plurality of multipliers further comprises a plurality of switches and a plurality of branches that include the plurality of switches and the first group of capacitors. In some examples, the second group of capacitors connect the plurality of branches, and a capacitance of the second group of capacitors is greater than a capacitance of the first group of capacitors. In some examples, the plurality of switches is configured to electrically connect or disconnect from an input analog signal based on the first digital signals.

Further, in some examples the plurality of capacitors and the plurality of switches form a C-2C ladder. Moreover in some examples, the plurality of capacitors includes a plurality of pairs of capacitors that each correspond to a different bit. The method 800 further includes in some examples, generating, with a second plurality of multipliers of the MAC, a second analog signal based on second digital signals, where the second plurality of multipliers includes a second plurality of capacitors and adding the first and second analog signal. In some examples, the first digital signals are associated with weights of a neural network.

Figure 4:
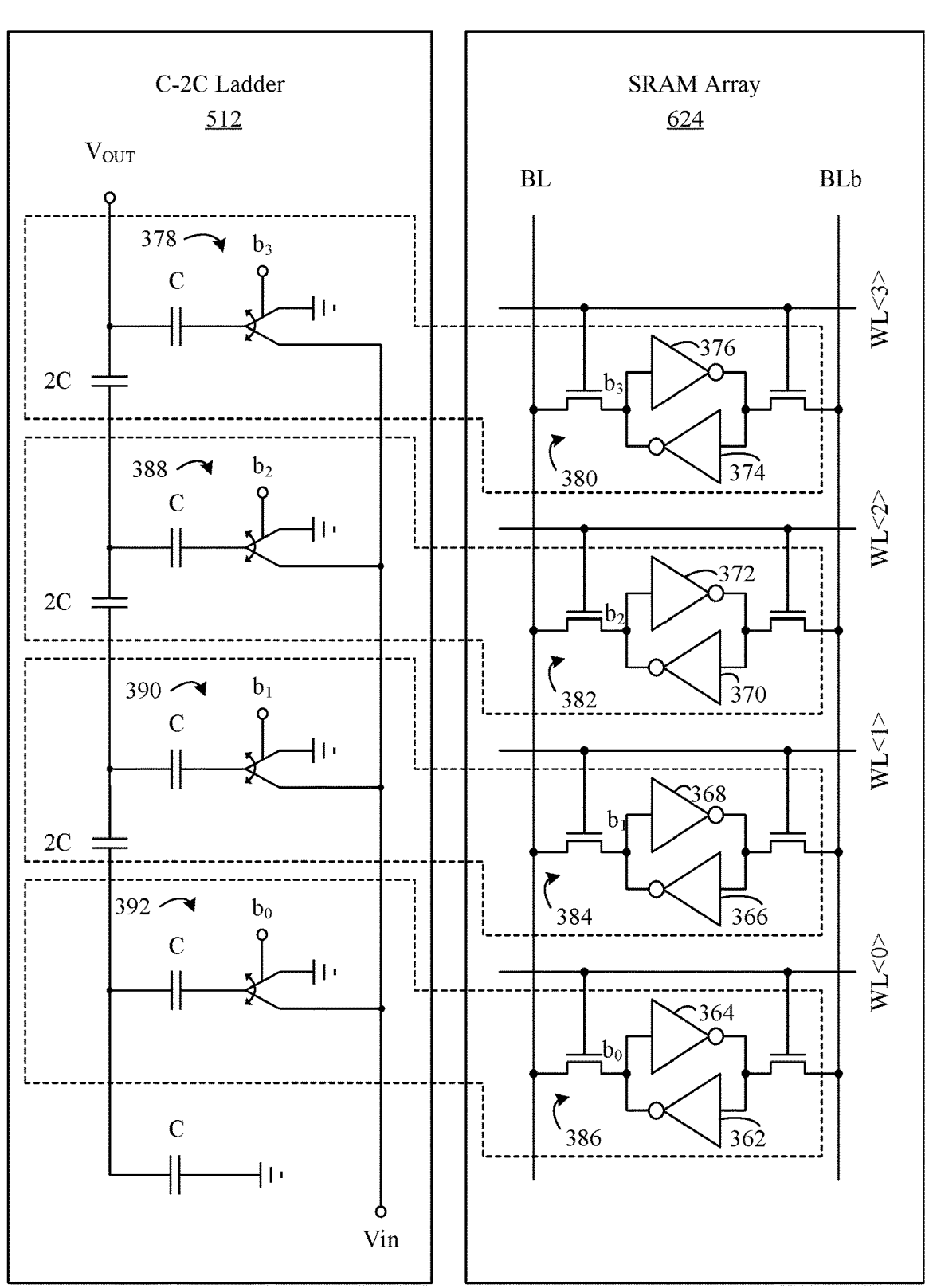
FIG. 4 is a block diagram of an example of a SRAM in-memory multiplier architecture according to an embodiment.

FIG. 4 illustrates an example of a SRAM in-memory multiplier architecture 394. The SRAM in-memory multiplier architecture 394 includes a C2C ladder 512 that includes first, second, third and fourth multipliers 378, 388, 390, 392. The SRAM in-memory multiplier architecture 394 further includes a SRAM array 624 that includes first, second, third and fourth SRAM memory cells 380, 382, 384, 386 that generate digital bits $b_0$, $b_1$, $b_2$, $b_3$ for a same weight (e.g., values for different bit positions 0-3 of the weight) and output the same to the first, second, third and fourth multipliers 378, 388, 390, 392. For example, inverters 362, 364, 366, 368, 370, 372, 374, 376 may be controlled by signals from bit lines BL, BLb and word line<1>-word line<3> and through transistors to generate digital bits $b_0$, $b_1$, $b_2$, $b_3$. The first, second, third and fourth multipliers 378, 388, 390, 392 may execute similarly to as described above with respect to in-memory multiplier architecture 300 (FIG. 1A) and MAC architecture 344 (FIG. 2) to generate output signals that are superimposed on each other.

Figure 5:
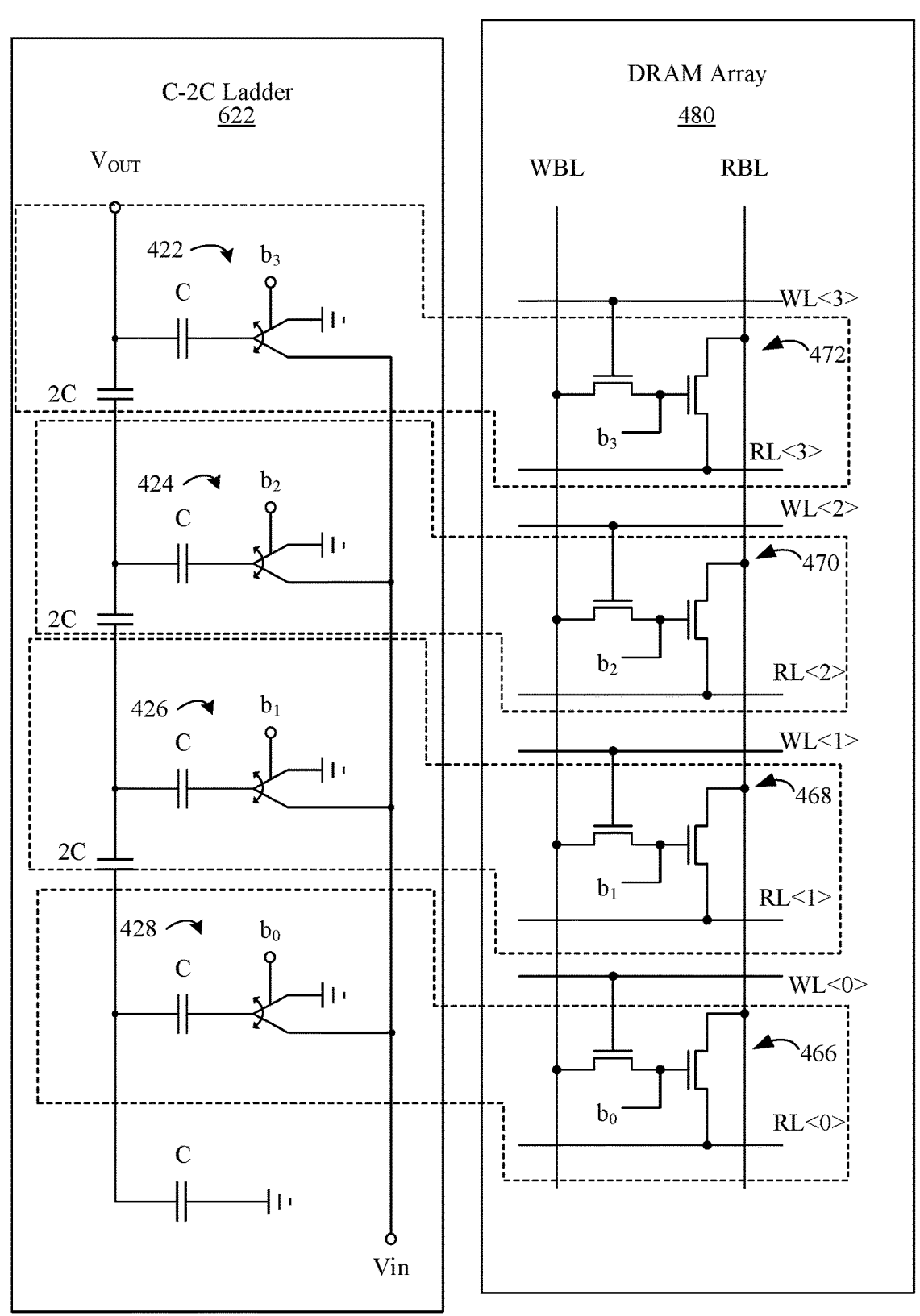
FIG. 5 is a block diagram of an example of a dynamic random-access memory multiplier architecture according to an embodiment.

FIG. 5 illustrates an example of a Dynamic random-access memory (DRAM) multiplier architecture 438. The DRAM multiplier architecture 438 includes a C2C ladder 622 that includes first, second, third and fourth multipliers 422, 424, 426, 428. The DRAM multiplier architecture 438 further includes a DRAM array 480 that includes first, second, third and fourth DRAM memory cells 472, 470, 468, 466 that generate digital bits $b_0$, $b_1$, $b_2$, $b_3$ for a same weight (e.g., values for different bit positions 0-3 of the weight) and output the same to the first, second, third and fourth multipliers 422, 424, 426, 428. For example, DRAM memory cells 472, 470, 468, 466 may be controlled by signals from bit lines BL, BLb and word line<1>-word line<3> and transistors to generate digital bits $b_0$, $b_1$, $b_2$, $b_3$. The first, second, third and fourth multipliers 422, 424, 426, 428 may execute similarly to as described above with respect to in-memory multiplier architecture 300 (FIG. 1A) and MAC architecture 344 (FIG. 2) to generate output signals that are superimposed on each other.

Figure 6:
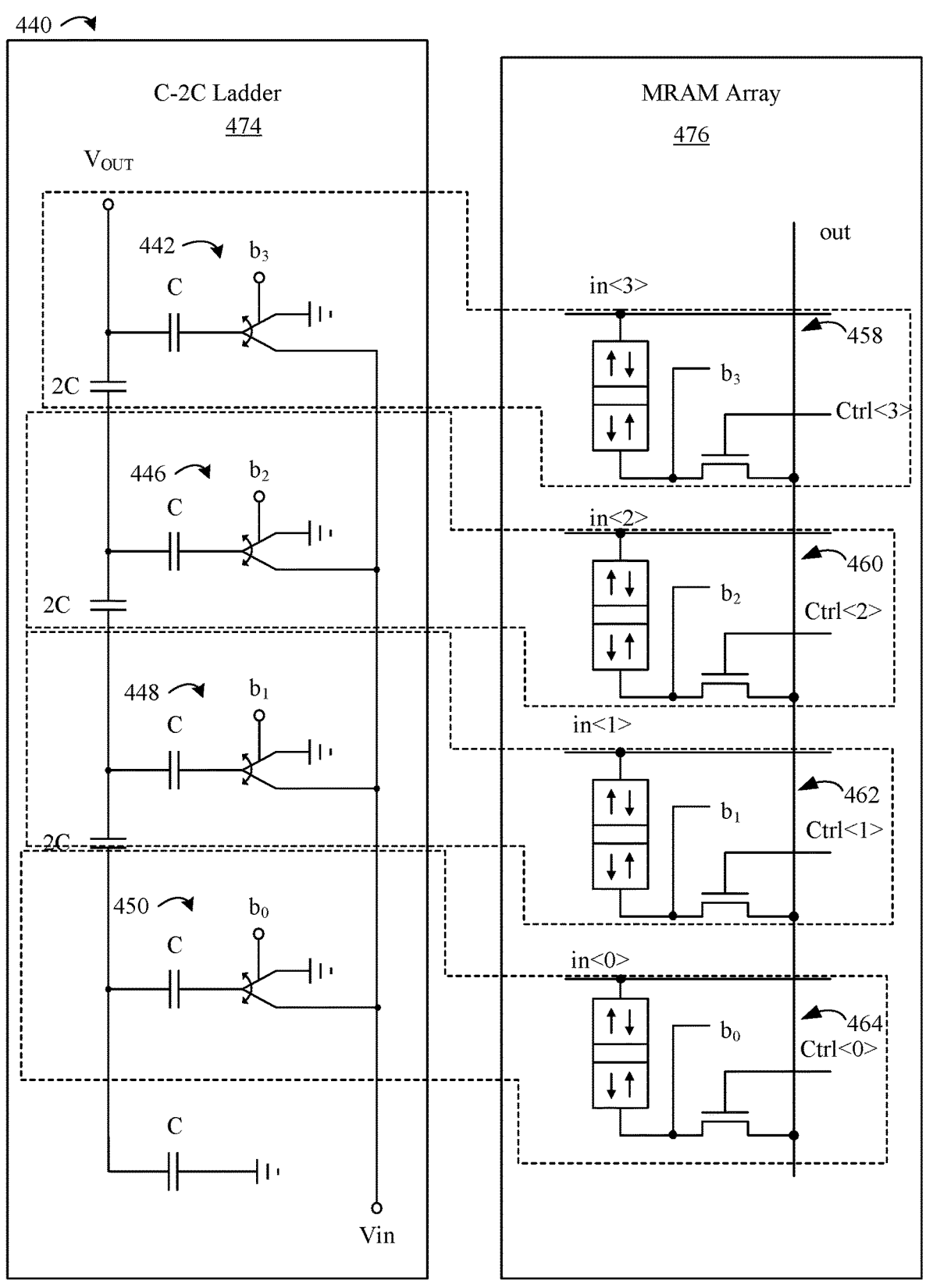
FIG. 6 is a block diagram of an example of a Magnetoresistive random-access memory multiplier architecture according to an embodiment.

FIG. 6 illustrates an example of a Magnetoresistive random-access memory (MRAM) multiplier architecture 440. The MRAM multiplier architecture 440 includes a C2C ladder 474 that includes first, second, third and fourth multipliers 442, 446, 448, 450. The MRAM multiplier architecture 440 further includes a MRAM array 476 that includes first, second, third and fourth MRAM memory cells 458, 460, 462, 464 that generate digital bits $b_0$, $b_1$, $b_2$, $b_3$ for a same weight (e.g., values for different bit positions 0-3 of the weight) and output the same to the first, second, third and fourth multipliers 442, 446, 448, 450. For example, MRAM memory cells 458, 460, 462, 464 may be controlled by signals from control lines ctrl<0>-ctrl<3> to generate digital bits $b_0$, $b_1$, $b_2$, $b_3$. The first, second, third and fourth multipliers 442, 446, 448, 450 may execute similarly to as described above with respect to in-memory multiplier architecture 300 (FIG. 1A) and MAC architecture 344 (FIG. 2) to generate output signals that are superimposed on each other.

Figure 7:
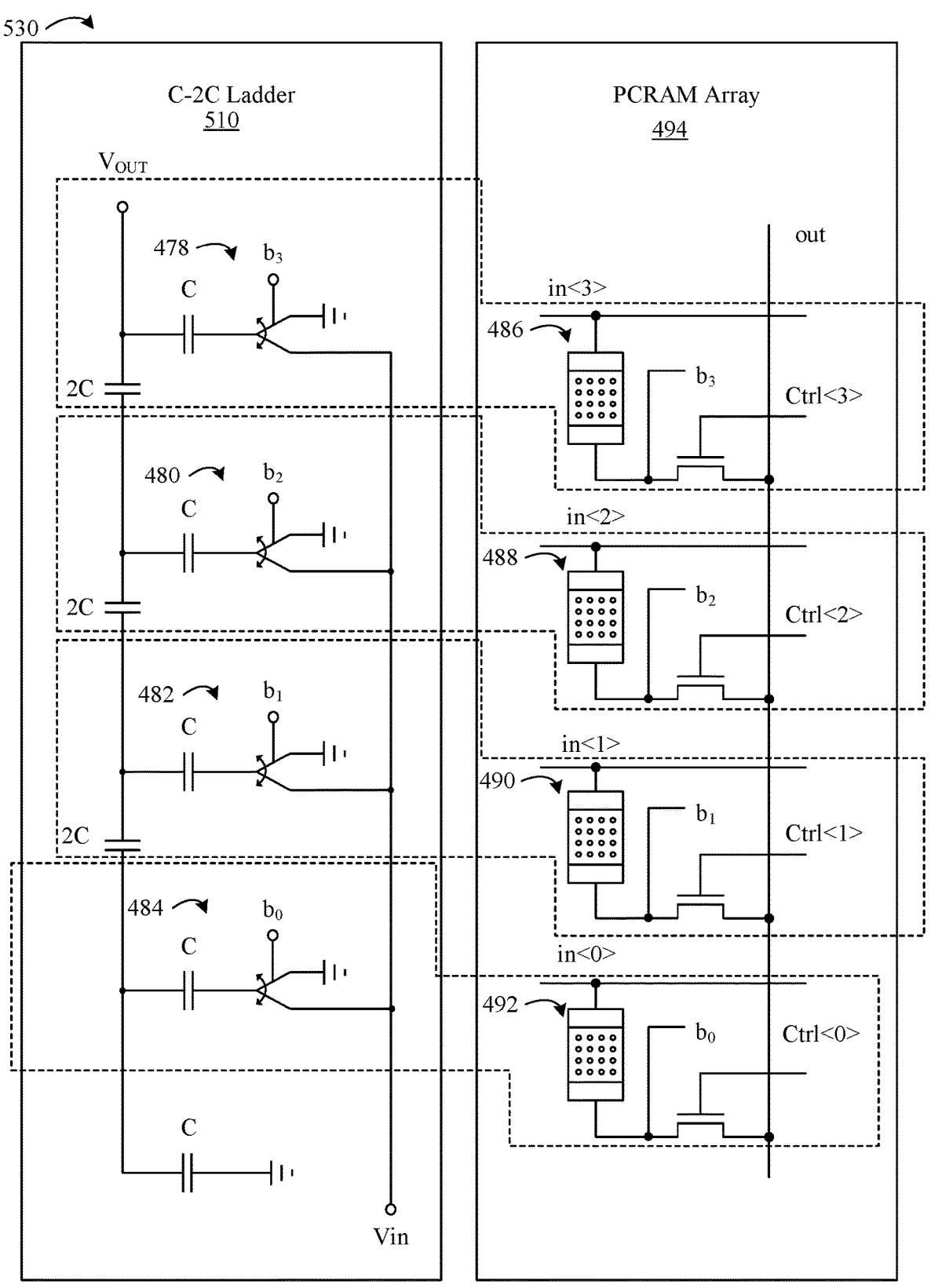
FIG. 7 is a block diagram of an example of a phase-change memory (PCRAM) multiplier architecture according to an embodiment.

FIG. 7 illustrates an example of a phase-change memory (PCRAM) multiplier architecture 530. The PCRAM multiplier architecture 530 includes a C2C ladder 510 that includes first, second, third and fourth multipliers 478, 480, 482, 484. The PCRAM multiplier architecture 530 further includes a PCRAM array 494 that includes first, second, third and fourth PCRAM memory cells 486, 488, 490, 492 that generate digital bits $b_0$, $b_1$, $b_2$, $b_3$ for a same weight (e.g., values for different bit positions 0-3 of the weight) and output the same to the first, second, third and fourth multipliers 478, 480, 482, 484. For example, PCRAM memory cells 486, 488, 490, 492 may be controlled by signals from control lines ctrl<0>-ctrl<3> to generate digital bits $b_0$, $b_1$, $b_2$, $b_3$. The first, second, third and fourth multipliers 478, 480, 482, 484 may execute similarly to as described above with respect to in-memory multiplier architecture 300 (FIG. 1A) and MAC architecture 344 (FIG. 2) to generate output signals that are superimposed on each other.

Figure 8:
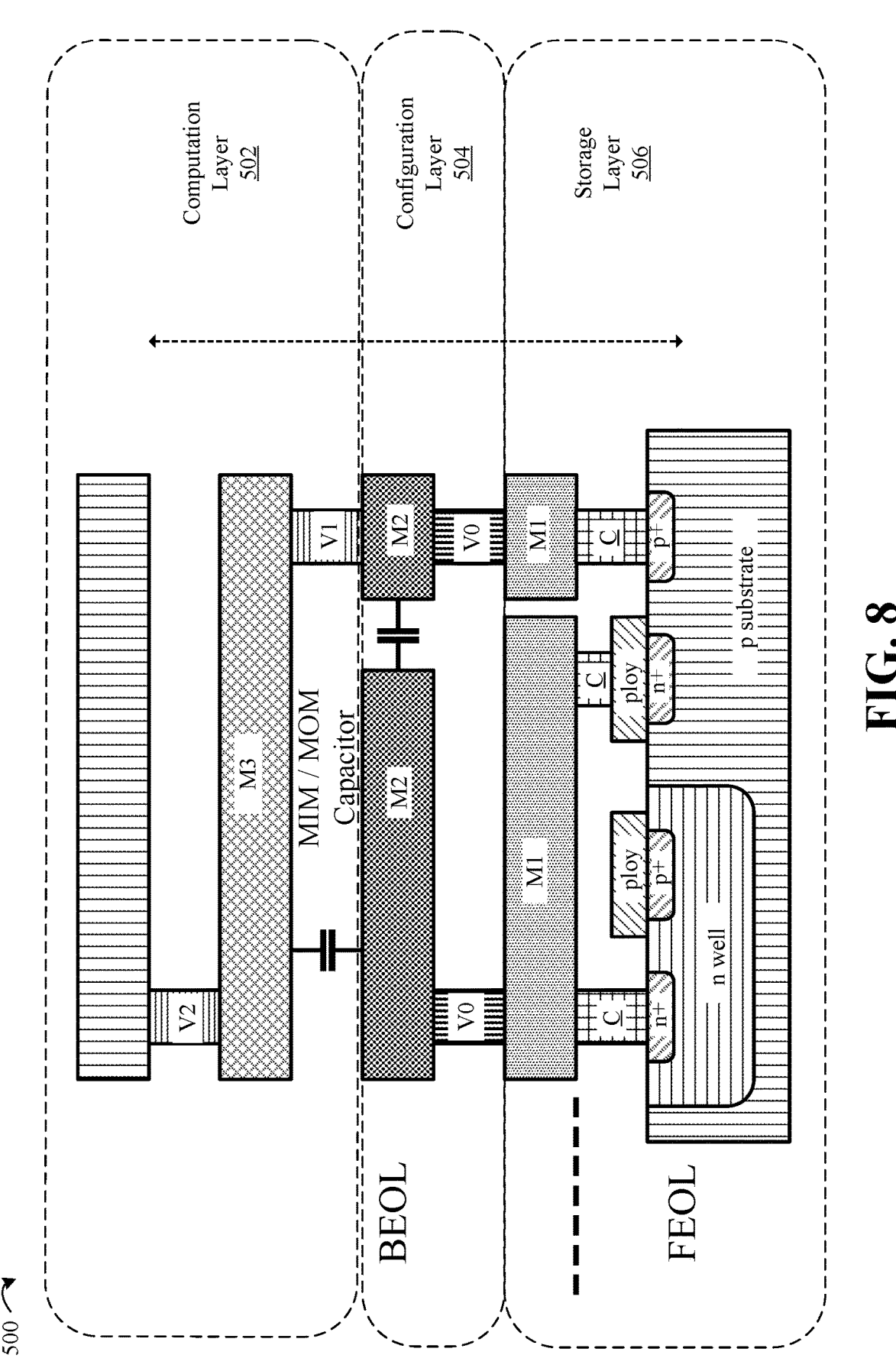
FIG. 8 is a block diagram of an example of a an in-memory multiplier architecture according to an embodiment.

FIG. 8 illustrates an in-memory multiplier architecture 500. The in-memory multiplier architecture 500 may be a more detailed schematic of the in-memory multiplier architecture 300 (FIG. 1A) and MAC architecture 344 (FIG. 2) already described. In detail, a computation layer 502 (e.g., a multiplier), configuration layer 504 (e.g., communication interface) and storage layer 506 (e.g., memory cell) are stacked directly on each other. Doing so enables efficient area usage and scalability.

Figures 9, 10:
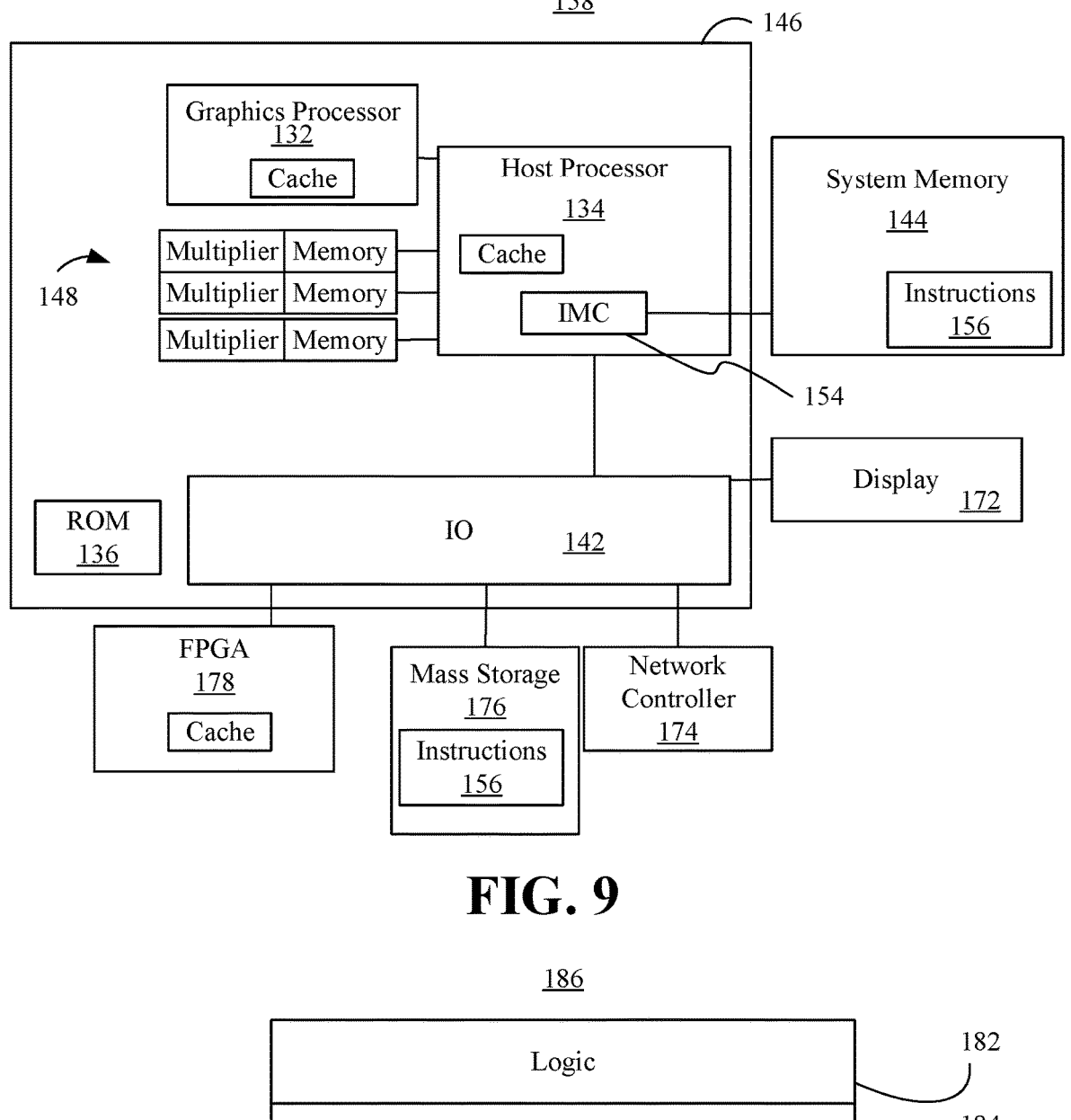
FIG. 9 is a block diagram of an example of an in-memory MAC computing system according to an embodiment.
FIG. 10 is an illustration of an example of a semiconductor apparatus according to an embodiment.

Turning now to FIG. 9, a memory-efficient computing system 158 is shown. The system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot), etc., or any combination thereof. In the illustrated example, the system 158 includes a host processor 134 (e.g., CPU) having an integrated memory controller (IMC) 154 that is coupled to a system memory 144 with instructions 156 that implement some aspects of the embodiments herein when executed.

The illustrated system 158 also includes an input output (IO) module 142 implemented together with the host processor 134, a graphics processor 132 (e.g., GPU), ROM 136 and arithmetic memory cells 148 on a semiconductor die 146 as a system on chip (SoC). The illustrated IO module 142 communicates with, for example, a display 172 (e.g., touch screen, liquid crystal display/LCD, light emitting diode/LED display), a network controller 174 (e.g., wired and/or wireless), FPGA 178 and mass storage 176 (e.g., hard disk drive/HDD, optical disk, solid state drive/SSD, flash memory) that may also include the instructions 156. Furthermore, the SoC 146 may further include processors (not shown) and/or arithmetic memory cells 148 dedicated to artificial intelligence (AI) and/or neural network (NN) processing. For example, the system SoC 146 may include vision processing units (VPUs,), tensor processing units (TPUs) and/or other AI/NN-specific processors such as arithmetic memory cells 148, etc. In some embodiments, any aspect of the embodiments described herein may be implemented in the processors and/or accelerators dedicated to AI and/or NN processing such as the arithmetic memory cells 148, the graphics processor 132 and/or the host processor 134. The system 158 may communicate with one or more edge nodes through the network controller 174 to receive weight updates and activation signals.

It is worthwhile to note that the system 158 and the arithmetic memory cells 148 may implement in-memory multiplier architecture 300 (FIG. 1A), C-2C ladder (600), MAC architecture 344 (FIGS. 2A and 2B), method 800 (FIG. 3), SRAM in-memory multiplier architecture 394 (FIG. 4), DRAM multiplier architecture 438 (FIG. 5), MRAM multiplier architecture 440 (FIG. 6), PCRAM architecture 530 (FIG. 7) and in-memory multiplier architecture 500 (FIG. 8) already discussed. The illustrated computing system 158 is therefore considered to implement new functionality and is performance-enhanced at least to the extent that it enables the computing system 158 to execute operate on neural network data at a lower latency, reduced power and with greater area efficiency.

FIG. 10 shows a semiconductor apparatus 186 (e.g., chip, die, package). The illustrated apparatus 186 includes one or more substrates 184 (e.g., silicon, sapphire, gallium arsenide) and logic 182 (e.g., transistor array and other integrated circuit/IC components) coupled to the substrate(s) 184. In an embodiment, the apparatus 186 is operated in an application development stage and the logic 182 performs one or more aspects of the embodiments described herein, for example, in-memory multiplier architecture 300 (FIG. 1A), C-2C ladder (600), MAC architecture 344 (FIGS. 2A and 2B), method 800 (FIG. 3), SRAM in-memory multiplier architecture 394 (FIG. 4), DRAM multiplier architecture 438 (FIG. 5), MRAM multiplier architecture 440 (FIG. 6), PCRAM multiplier architecture 530 (FIG. 7) and in-memory multiplier architecture 500 (FIG. 8) already discussed. Thus, the logic 182 receives, with a first plurality of multipliers of a multiply-accumulator (MAC), first digital signals from a memory array, where the first plurality of multipliers includes a plurality capacitors. The logic 182 executes, with the first plurality of multipliers, multibit computation operations with the plurality of capacitors based on the first digital signals. The logic 182 generates, with the first plurality of multipliers, a first analog signal based on the multibit computation operations. The logic 182 may be implemented at least partly in configurable logic or fixed-functionality hardware logic. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 11:
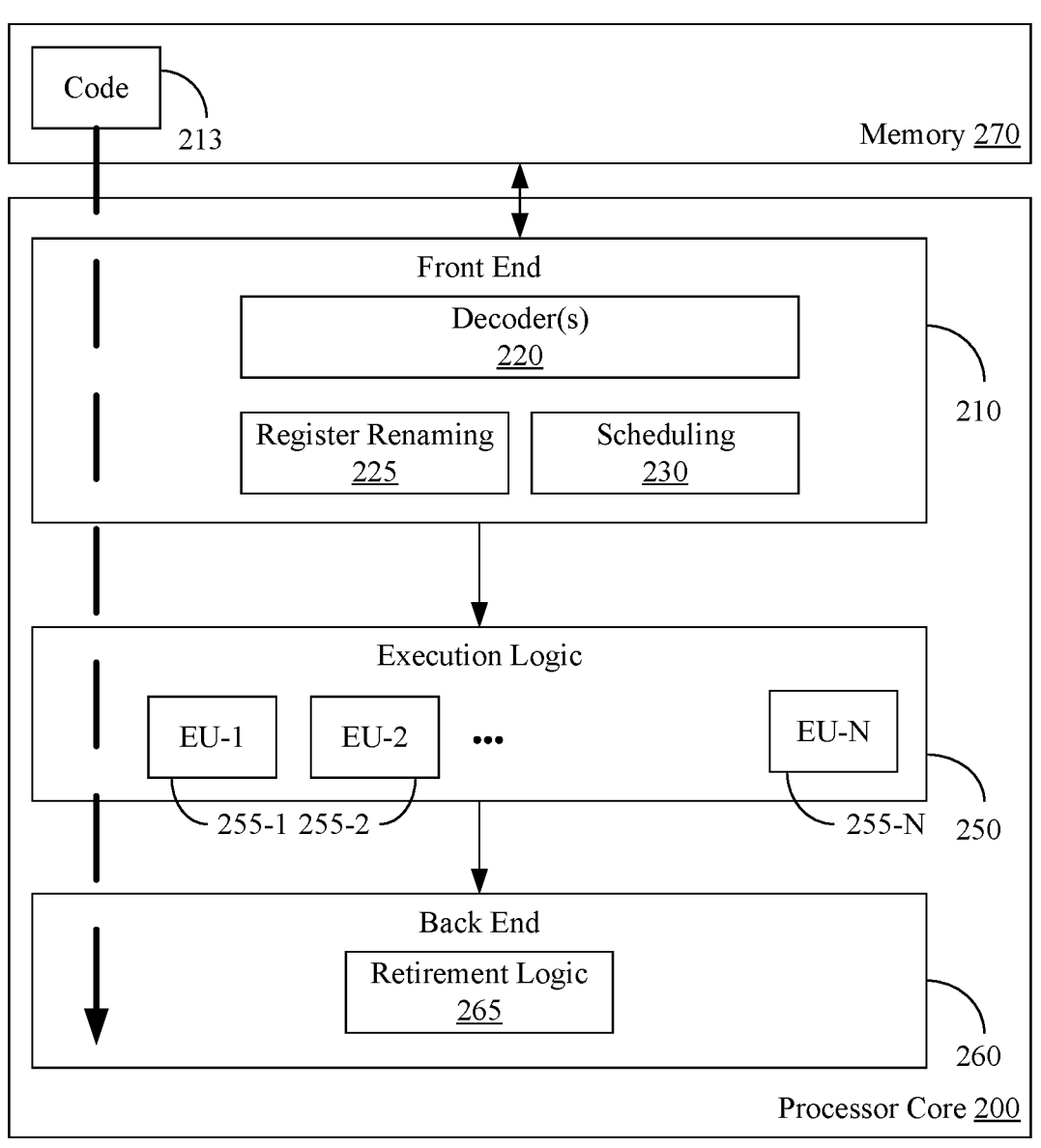
FIG. 11 is a block diagram of an example of a processor according to an embodiment.

FIG. 11 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 11, a processing element may alternatively include more than one of the processor core 200 illustrated in FIG. 11. The processor core 200 may be a single-threaded core or, for at least one embodiment, the processor core 200 may be multithreaded in that it may include more than one hardware thread context (or "logical processor") per core.

FIG. 11 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the embodiments such as, for example, in-memory multiplier architecture 300 (FIG. 1A), C-2C ladder (600), MAC architecture 344 (FIGS. 2A and 2B), method 800 (FIG. 3), SRAM in-memory multiplier architecture 394 (FIG. 4), DRAM multiplier architecture 438 (FIG. 5), MRAM multiplier architecture 440 (FIG. 6), PCRAM multiplier architecture 530 (FIG. 7) and in-memory multiplier architecture 500 (FIG. 8) already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 11, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 12:
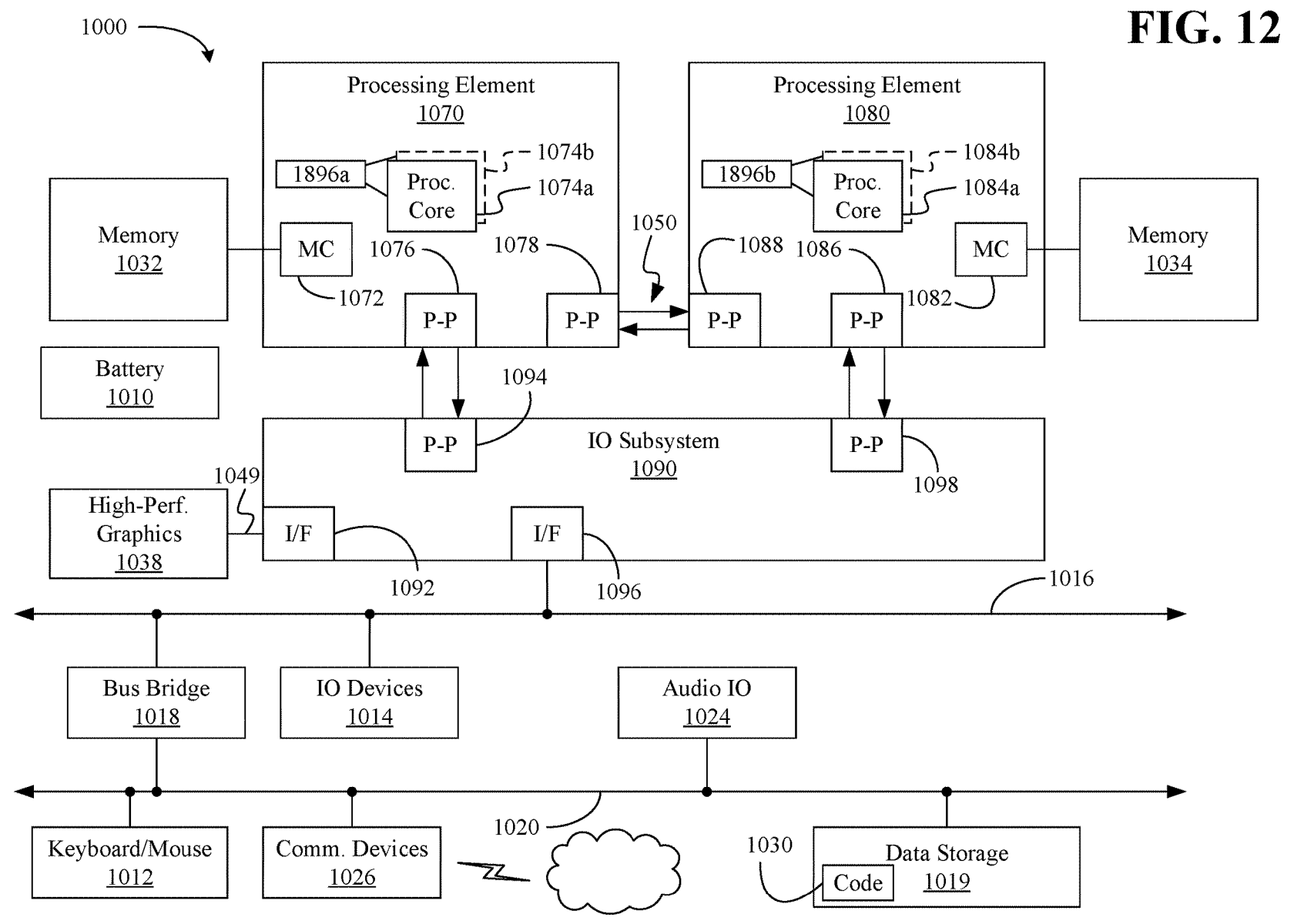

Referring now to FIG. 12, shown is a block diagram of a computing system 1000 embodiment in accordance with an embodiment. Shown in FIG. 12 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 12 may be implemented as a multi-drop bus rather than point-to-point interconnect.

As shown in FIG. 12, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 11.

Each processing element 1070, 1080 may include at least one shared cache 1896a, 1896b. The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 12, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 12, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 12, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement the one or more aspects of such as, for example, in-memory multiplier architecture 300 (FIG. 1A), C-2C ladder (600), MAC architecture 344 (FIGS. 2A and 2B), method 800 (FIG. 3), SRAM in-memory multiplier architecture 394 (FIG. 4), DRAM multiplier architecture 438 (FIG. 5), MRAM multiplier architecture 440 (FIG. 6), PCRAM multiplier architecture 530 (FIG. 7) and in-memory multiplier architecture 500 (FIG. 8) already discussed. Further, an audio I/O 1024 may be coupled to second bus 1020 and a battery 1010 may supply power to the computing system 1000.

Note that other embodiments are contemplated. For example, instead of the point-to-point architecture of FIG. 12, a system may implement a multi-drop bus or another such communication topology. Also, the elements of FIG. 12 may alternatively be partitioned using more or fewer integrated chips than shown in FIG. 12.

Additional Notes and Examples

Example 1 includes a computing system comprising a processor, a memory array, and a multiply-accumulator (MAC), wherein the MAC includes a first plurality of multipliers that includes a plurality of capacitors, wherein the first plurality of multipliers is configured to receive first digital signals from the memory array, execute multibit computation operations with the plurality of capacitors based on the first digital signals, and generate a first analog signal based on the multibit computation operations.

Example 2 includes the computing system of example 1, wherein the plurality of capacitors includes a first group of capacitors and a second group of capacitors, the first plurality of multipliers further comprises a plurality of switches, and a plurality of branches that include the plurality of switches and the first group of capacitors.

Example 3 includes the computing system of example 2, wherein the second group of capacitors connect the plurality of branches, further wherein a capacitance of the second group of capacitors is greater than a capacitance of the first group of capacitors.

Example 4 includes the computing system of any one of examples 1 to 3, wherein the plurality of switches is to be configured to electrically connect or disconnect from an input analog signal based on the first digital signals.

Example 5 includes the computing system of any one of examples 1 to 4, wherein the plurality of capacitors and the plurality of switches form a C-2C ladder.

Example 6 includes the computing system of any one of examples 1 to 5, wherein the plurality of capacitors includes a plurality of pairs of capacitors that each correspond to a different bit.

Example 7 includes the computing system of example 1, wherein the MAC further comprises a second plurality of multipliers that includes a second plurality of capacitors that is to generate a second analog signal based on second digital signals, and an adder to add the first and second analog signal.

Example 8 includes the computing system of any one of examples 1 to 7, wherein the first digital signals are associated with weights of a neural network.

Example 9 includes a semiconductor apparatus comprising one or more substrates, and logic coupled to the one or more substrates, wherein the logic is implemented at least partly in one or more configurable or fixed-functionality hardware, the logic and comprising a memory array, and a multiply-accumulator (MAC) connected to the memory array, wherein the MAC includes a first plurality of multipliers that includes a plurality of capacitors, wherein the first plurality of multipliers is configured to receive first digital signals from the memory array, execute multibit computation operations with the plurality of capacitors based on the first digital signals, and generate a first analog signal based on the multibit computation operations.

Example 10 includes the apparatus of example 9, wherein the plurality of capacitors includes a first group of capacitors and a second group of capacitors, the first plurality of multipliers further comprises a plurality of switches, and a plurality of branches that include the plurality of switches and the first group of capacitors.

Example 11 includes the apparatus of example 10, wherein the second group of capacitors connect the plurality of branches, further wherein a capacitance of the second group of capacitors is greater than a capacitance of the first group of capacitors.

Example 12 includes the apparatus of any one of examples 9 to 11, wherein the plurality of switches is to be configured to electrically connect or disconnect from an input analog signal based on the first digital signals.

Example 13 includes the apparatus of any one of examples 9 to 12, wherein the plurality of capacitors and the plurality of switches form a C-2C ladder.

Example 14 includes the apparatus of any one of examples 9 to 13, wherein the plurality of capacitors includes a plurality of pairs of capacitors that each correspond to a different bit.

Example 15 includes the apparatus of example 9, wherein the MAC further comprises a second plurality of multipliers that includes a second plurality of capacitors that is to generate a second analog signal based on second digital signals, and an adder to add the first and second analog signal.

Example 16 includes the apparatus of examples 9 to 15, wherein the first digital signals are associated with weights of a neural network.

Example 17 includes the apparatus of examples 9 to 15, wherein the logic coupled to the one or more substrates includes transistor channel regions that are positioned within the one or more substrates.

Example 18 includes a method comprising receiving, with a first plurality of multipliers of a multiply-accumulator (MAC), first digital signals from a memory array, wherein the first plurality of multipliers includes a plurality of capacitors, executing, with the first plurality of multipliers, multibit computation operations with the plurality of capacitors based on the first digital signals, and generating, with the first plurality of multipliers, a first analog signal based on the multibit computation operations.

Example 19 includes the method of example 18, wherein the plurality of capacitors includes a first group of capacitors and a second group of capacitors, the first plurality of multipliers further comprises a plurality of switches, and a plurality of branches that include the plurality of switches and the first group of capacitors.

Example 20 includes the method of example 19, wherein the second group of capacitors connect the plurality of branches, further wherein a capacitance of the second group of capacitors is greater than a capacitance of the first group of capacitors.

Example 21 includes the method of any one of examples 18 to 20, wherein the plurality of switches is configured to electrically connect or disconnect from an input analog signal based on the first digital signals.

Example 22 includes the method of any one of examples 18 to 21, wherein the plurality of capacitors and the plurality of switches form a C-2C ladder.

Example 23 includes the method of any one of examples 18 to 22, wherein the plurality of capacitors includes a plurality of pairs of capacitors that each correspond to a different bit.

Example 24 includes the method of example 18, further comprising generating, with a second plurality of multipliers of the MAC, a second analog signal based on second digital signals, wherein the second plurality of multipliers includes a second plurality of capacitors, and adding the first and second analog signal.

Example 25 includes the method of any one of examples 18 to 24, wherein the first digital signals are associated with weights of a neural network.

Example 26 includes a semiconductor apparatus comprising means for receiving, with a first plurality of multipliers of a multiply-accumulator (MAC), first digital signals from a memory array, wherein the first plurality of multipliers includes a plurality of capacitors, means for executing, with the first plurality of multipliers, multibit computation operations with the plurality of capacitors based on the first digital signals, and means for generating, with the first plurality of multipliers, a first analog signal based on the multibit computation operations.

Example 27 includes the apparatus of example 26, wherein the plurality of capacitors includes a first group of capacitors and a second group of capacitors, the first plurality of multipliers further comprises a plurality of switches, and a plurality of branches that include the plurality of switches and the first group of capacitors.

Example 28 includes the apparatus of example 27, wherein the second group of capacitors connect the plurality of branches, further wherein a capacitance of the second group of capacitors is greater than a capacitance of the first group of capacitors.

Example 29 includes the apparatus of any one of examples 26 to 28, wherein the plurality of switches is configured to electrically connect or disconnect from an input analog signal based on the first digital signals.

Example 30 includes the apparatus of any one of examples 26 to 29, wherein the plurality of capacitors and the plurality of switches form a C-2C ladder.

Example 31 includes the apparatus of any one of examples 26 to 30, wherein the plurality of capacitors includes a plurality of pairs of capacitors that each correspond to a different bit.

Example 32 includes the apparatus of example 26, further comprising means for generating, with a second plurality of multipliers of the MAC, a second analog signal based on second digital signals, wherein the second plurality of multipliers includes a second plurality of capacitors, and means for adding the first and second analog signal.

Example 33 includes the apparatus of any one of examples 26 to 32, wherein the first digital signals are associated with weights of a neural network.

Thus, technology described herein may provide for enhanced in-memory computing architectures. Such embodiments execute with lower latency and power, and at a reduced form factor.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
a processor;
a memory array to store and output digital signals corresponding to bits of a multibit value; and
a multiply-accumulator (MAC), wherein the MAC includes a plurality of multipliers, and the plurality of multipliers include a plurality of capacitors including a group of capacitors and a further group of capacitors, a plurality of switches, and a plurality of branches that include the plurality of switches and the group of capacitors;
wherein the plurality of multipliers are configured to:
receive, by the plurality of switches, the digital signals from the memory array,
execute multibit computation operations with the plurality of capacitors and the plurality of switches forming a C-2C ladder based on the digital signals by controlling the plurality of switches using the digital signals to electrically connect or disconnect an input analog signal to the group of capacitors, and
generate an output analog signal based on the multibit computation operations.

2. The computing system of claim 1, wherein thesecond further group of capacitors connect the plurality of branches, further wherein a capacitance of the further group of capacitors is greater than a capacitance of the group of capacitors.

3. The computing system of claim 1, wherein the plurality of capacitors include a plurality of pairs of capacitors that each correspond to a different bit of the multibit value.

4. The computing system of claim 1, wherein the MAC further comprises:

a plurality of further multipliers that include a plurality of further capacitors that is to generate a further output analog signal based on further digital signals; and an adder to add the output analog signal and the further output analog signal.

5. The computing system of claim 1, wherein the multibit value is associated with a weight of a neural network.

6. The computing system of claim 1, wherein the input analog signal is associated with an input activation of a neural network, and the output analog signal is associated with an output activation of the neural network.

7. The computing system of claim 1, wherein the output analog signal is associated with a product of the input analog signal and the multibit value.

8. The computing system of claim 1, wherein executing the multibit computation operations further comprises controlling the plurality of switches using the digital signals to electrically connect or disconnect a ground node to the group of capacitors.

9. A semiconductor apparatus comprising:

one or more substrates; and logic coupled to the one or more substrates, wherein the logic is implemented at least partly in one or more of configurable or fixed-functionality hardware, the logic comprising:

a memory array to store and output digital signals corresponding to bits of a multibit value; and a multiply-accumulator (MAC) connected to the memory array, wherein the MAC includes a plurality of multipliers, and the plurality of multipliers include a plurality of capacitors including a group of capacitors and a further group of capacitors, a plurality of switches, and a plurality of branches that include the plurality of switches and the group of capacitors;

wherein the plurality of multipliers are configured to:

receive, by the plurality of switches, the digital signals from the memory array;

execute multibit computation operations with the plurality of capacitors and the plurality of switches forming a C-2C ladder based on the digital signals by controlling the plurality of switches using the digital signals to electrically connect or disconnect an input analog signal to the group of capacitors; and generate an output analog signal based on the multibit computation operations.

10. The semiconductor apparatus of claim 9, wherein the further group of capacitors connect the plurality of branches, further wherein a capacitance of the further group of capacitors is greater than a capacitance of the group of capacitors.

11. The semiconductor apparatus of claim 9, wherein the plurality of capacitors include a plurality of pairs of capacitors that each correspond to a different bit of the multibit value.

12. The semiconductor apparatus of claim 9, wherein the MAC further comprises:

a plurality of further multipliers that include a plurality of further capacitors that are to generate a further output analog signal based on further digital signals; and an adder to add the output analog signal and the further output analog signal.

13. The semiconductor apparatus of claim 9, wherein the multibit value is associated with a weight of a neural network.

14. The semiconductor apparatus of claim 9, wherein the logic coupled to the one or more substrates includes transistor channel regions that are positioned within the one or more substrates.

15. The semiconductor apparatus of claim 9, wherein the input analog signal is associated with an input activation of a neural network, and the output analog signal is associated with an output activation of the neural network.

16. The semiconductor apparatus of claim 9, wherein the output analog signal is associated with a product of the input analog signal and the multibit value.

17. The semiconductor apparatus of claim 9, wherein executing the multibit computation operations further comprises controlling the plurality of switches using the digital signals to electrically connect or disconnect a ground node to the group of capacitors.

18. A method comprising:

receiving, with a plurality of switches of a plurality of multipliers of a multiply-accumulator (MAC), digital signals corresponding to bits of a multibit value from a memory array, wherein the plurality of multipliers include a plurality of capacitors including a group of capacitors and a further group of capacitors, the plurality of switches, and a plurality of branches that include the plurality of switches and the group of capacitors;

executing, with the plurality of capacitors and the plurality of switches forming a C-2C ladder, multibit computation operations based on the digital signals by controlling the plurality of switches using the digital signals to electrically connect or disconnect an input analog signal to the group of capacitors; and generating, with the plurality of multipliers, an output analog signal based on the multibit computation operations.

19. The method of claim 18, wherein the further group of capacitors connect the plurality of branches, further wherein a capacitance of the further group of capacitors is greater than a capacitance of the group of capacitors.

20. The method of claim 18, wherein the plurality of capacitors include a plurality of pairs of capacitors that each correspond to a different bit of the multibit value.

21. The method of claim 18, further comprising:

generating, with a plurality of further multipliers of the MAC, a further output analog signal based on further digital signals, wherein the plurality of further multipliers include a plurality of further capacitors; and adding the output analog signal and the further output analog signal.

22. The method of claim 18, wherein the multibit value is associated with a weights of a neural network.

23. The method of claim 18, wherein the input analog signal is associated with an input activation of a neural network, and the output analog signal is associated with an output activation of the neural network.

24. The method of claim 18, wherein the output analog signal is associated with a product of the input analog signal and the multibit value.

25. The method of claim 18, wherein executing the multibit computation operations further comprises controlling the plurality of switches using the digital signals to electrically connect or disconnect a ground node to the group of capacitors.

* * * * *